United States Patent
Chawda et al.

(10) Patent No.: US 10,360,328 B2
(45) Date of Patent: Jul. 23, 2019

(54) METHODS FOR CONVERTING CIRCUITS IN CIRCUIT SIMULATION PROGRAMS

(71) Applicant: Texas Instruments Incorporated, Dallas, TX (US)

(72) Inventors: Pradeep Kumar Chawda, Cupertino, CA (US); Makram Mansour, San Jose, CA (US); Satyanandakishore Vanapalli, Campell, CA (US); Ashwin Vishnu Kamath, Bangalore (IN); Kian Haur Chong, McKinney, TX (US); Dien Mac, San Jose, CA (US); Jeff Perry, Cupertino, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 164 days.

(21) Appl. No.: 15/053,816

(22) Filed: Feb. 25, 2016

(65) Prior Publication Data
US 2016/0253439 A1    Sep. 1, 2016

Related U.S. Application Data

(60) Provisional application No. 62/121,007, filed on Feb. 26, 2015.

(51) Int. Cl.
*G06F 17/50* (2006.01)

(52) U.S. Cl.
CPC ...... *G06F 17/5022* (2013.01); *G06F 17/5036* (2013.01)

(58) Field of Classification Search
CPC ............ G06F 17/5068; G06F 17/5009; G06F 11/263; G06F 17/5027; G06F 17/5036; G06F 11/2205; G06F 11/25; G06F 11/3688; G06F 3/0484; G06F 9/4881; G06F 17/5045; G06F 1/163; G06F 3/00; G06F 3/017; G06F 17/505; G06F 8/41; G06F 2217/04; G06F 2217/68; G06F 8/20; G06F 8/53; G06F 17/5031; G06F 12/0811; G06F 12/0831; G06F 12/0862; G06F 12/0864; G06F 12/1027; G06F 13/287; G06F 15/17381; G06F 15/17387; G06F 15/76; G06F 15/8069; G06F 17/5059; G06F 2212/1016; G06F 2212/602; G06F 2212/6022; G06F 2212/6024; G06F 2212/6032; G06F 2217/62; G06F 2217/84; G06F 9/06; G06F 9/3004; G06F 9/30047;
(Continued)

(56) References Cited

U.S. PATENT DOCUMENTS

| | | | | |
|---|---|---|---|---|
| 2008/0256500 A1* | 10/2008 | Cobb | ............... | G06F 17/5081 716/106 |
| 2013/0298091 A1* | 11/2013 | Lee | ............... | G06F 17/5068 716/102 |
| 2014/0181768 A1* | 6/2014 | Yang | ............... | G06F 17/5081 716/107 |

* cited by examiner

*Primary Examiner* — Binh C Tat
(74) *Attorney, Agent, or Firm* — Ebby Abraham; Charles A. Brill; Frank D. Cimino

(57) ABSTRACT

A method for converting a circuit in a format of a first circuit simulation program to format of a second circuit simulation program includes identifying components in the circuit that are recognized by the second simulation program. Characteristics for components that are not recognized by the second simulation program are created. Connections in the circuit are formatted to a format that is recognized by the second simulation program. The components, characteristics, and connections are stored in a single computer-readable file.

8 Claims, 4 Drawing Sheets

(58) Field of Classification Search
CPC ............... G06F 9/3885; G06F 17/5072; G06F 17/5081; G06F 2217/82; G06F 17/504; G06F 11/3608; G06F 17/21; G06F 17/212; G06F 17/2705; G06F 17/5022; G06F 19/00; G06F 2203/011; G06F 2203/0384; G06F 2217/66; G06F 3/011; G06F 3/012; G06F 3/013; G06F 3/014; G06T 2207/30148; H01L 22/12; H01L 51/0031
USPC .................................................. 716/100–108
See application file for complete search history.

| SPICE NAME | DESCRIPTION |
|---|---|
| tstep | PRINT STEP |
| tstop | FINAL TIME |
| tstart | RESULTS DELAY |
| tmax | STOP CEILING |
| UIC | INITIAL CONDITIONS |
| abstol | BEST ACCURACY OF CURRENTS |
| vntol | BEST ACCURACY OF VOLTAGES |
| reltol | RELATIVE ACCURACY OF VOLTAGES AND CURRENTS |
| gear | INTEGRATION METHOD |
| autotol | ELIMINATE CONVERGENCE PROBLEMS |
| Iteratio | LOCAL TRUNCATION ERROR* |
| gmin | MINIMUM CONDUCTANCE FOR ANY BRANCH |
| itl4 | ITERGRATION LIMIT AT ANY POINT IN THE TRANSIENT ANALYSIS |

FIG. 4

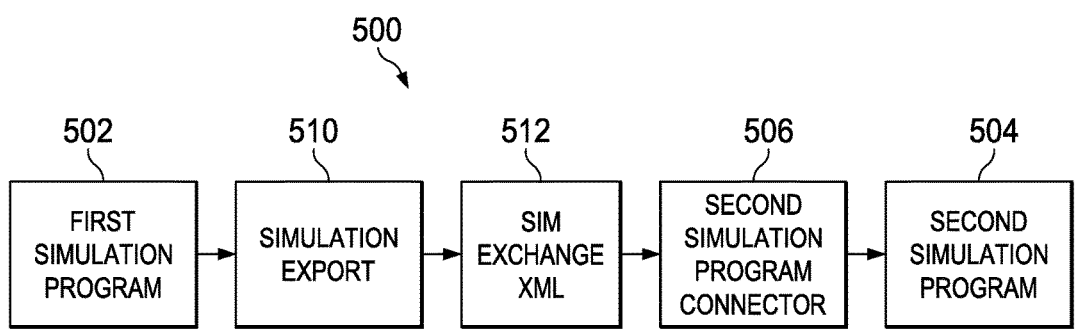

FIG. 5

METHODS FOR CONVERTING CIRCUITS IN CIRCUIT SIMULATION PROGRAMS

CROSS-REFERENCE TO RELATED APPLICATION

This application claims priority to U.S. Provisional Patent Application Ser. No. 62/121,007, filed Feb. 26, 2015, entitled WEBENCH SIMULATION EXPORT TOOL, naming Pradeep Kumar Chawda et al. as inventors, which is hereby fully incorporated herein by reference for all purposes.

BACKGROUND

There are many different circuit simulation programs available to circuit designers. These programs enable designers to simulate different circuits without having to fabricate the circuits. For example, a designer enters the components and connections of a circuit into a simulation program, such as by a user interface. The designer may then select simulation conditions, such as input voltages and frequencies for simulation of the circuit. The simulation program then performs the simulation on the entered circuit based on the simulation conditions.

Different simulation programs have different characteristics. For example, some simulation programs operate online and others operate locally. Furthermore, some simulation programs have different libraries of components than other simulation programs. Therefore, users may want to convert a circuit developed on a first simulation program to a second simulation program. However, converting a circuit entered into a first simulation program to a second simulation program is not a straight forward task. For example, the circuit has to be reentered into the second simulation program, which is time consuming.

SUMMARY

A method for converting a circuit in a format of a first circuit simulation program to a format of a second circuit simulation program includes identifying components in the circuit that are recognized by the second simulation program. Characteristics for components that are not recognized by the second simulation program are created. Connections in the circuit are formatted to a format that is recognized by the second simulation program. The components, characteristics, and connections are stored in a single computer-readable file.

BRIEF DESCRIPTION OF THE DRAWINGS

FIG. 4 is a table of SPICE functions that may be adjusted to bring simulation results within predetermined limitations.

FIG. 5 is a block diagram of another example process for converting a circuit simulated in a first simulation program for simulation in a second simulation program.

DETAILED DESCRIPTION

Methods for converting a circuit simulated in a first circuit simulation program to a second circuit simulation program are disclosed herein. The methods may be performed by hardware or software and may be coded to machine-readable code for operation on a computer.

In some examples, a web based tool can export a circuit from a first circuit simulation program to multiple second circuit simulation programs, such as computer aided design (CAD) programs, and simulate the circuit offline using CAD tools. In some examples, the exported circuit is self-contained in a single file wherein the file has all the information including symbol, schematic, and simulation settings, which are required to simulate the circuit in the CAD tools offline. In some examples, the exported circuit can further be customized and simulated in the CAD tools or by the second simulation program offline. In some examples, the exported file is an XML file.

In some examples, the first circuit simulation program runs a simulation on the circuit under certain conditions, such as certain input voltages, frequencies, and the like. The first simulation program then converts the circuit to a format that is readable by the second circuit simulation program. The first simulation runs the simulation under the above described conditions in the second simulation program using the circuit format generated by the first simulation program. At this point there are two simulation results, one generated by the first simulation program and the second generated by the second simulation program using the format generated by the first simulation program. The first simulation program compares the two simulation results to check the accuracy of the conversion. If the first and second simulation results are within predetermined ranges of each other, the conversion is accurate and the first simulation program downloads or exports the file of the converted circuit.

Figure 1:
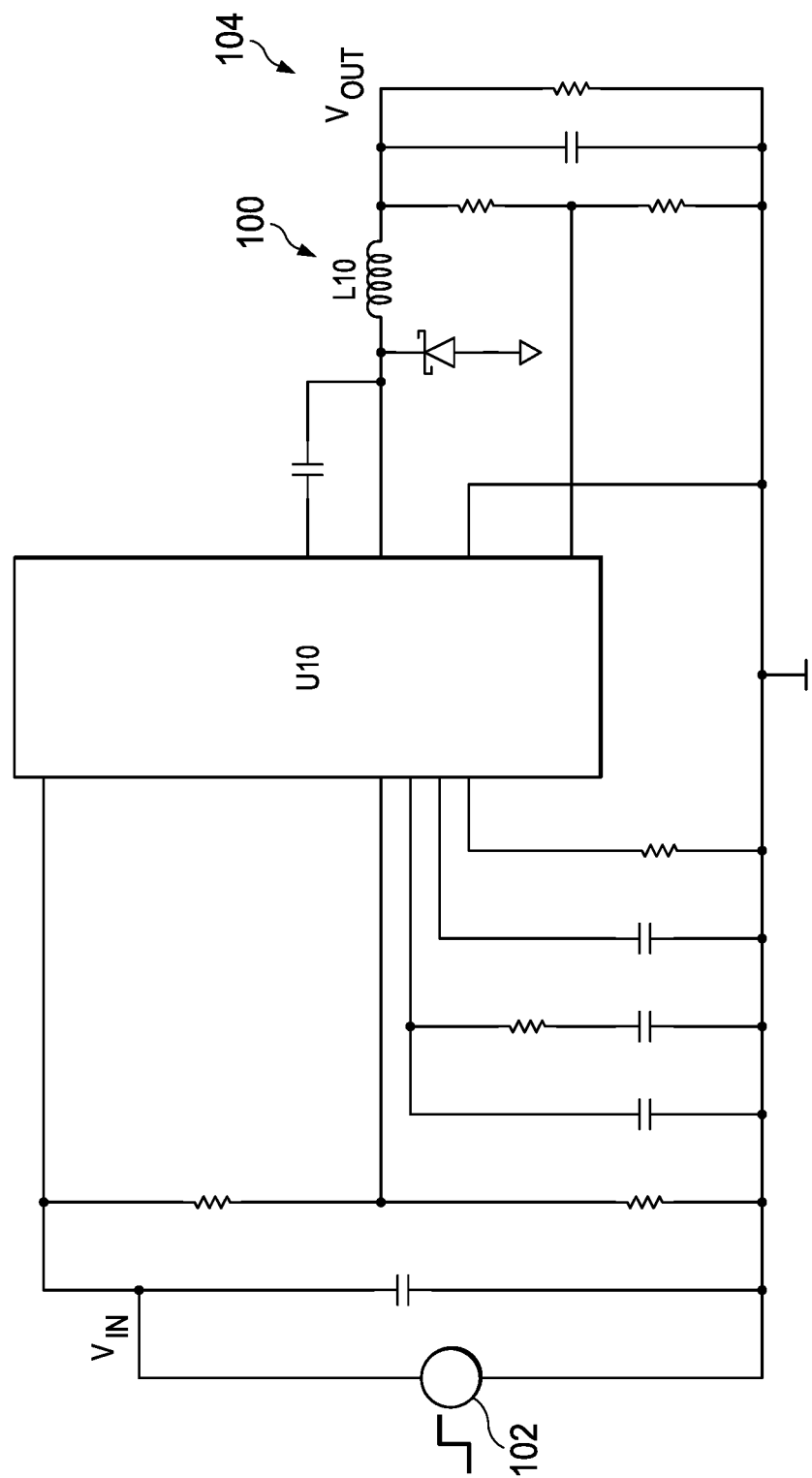
FIG. 1 is a schematic diagram of a circuit that is simulated by a first simulation program.

FIG. 1 is a schematic diagram of an example circuit 100 that is simulated by a first simulation program. The circuit 100 is exemplary and virtually any circuit may be simulated by the first simulation program. The circuit 100 may include a plurality of discrete components, such as diodes, resistors, and capacitors. Additionally, the circuit 100 includes an integrated circuit U10 that is coupled to a plurality of discrete components. A voltage input 102 provides an input voltage $V_{IN}$, which in the example of FIG. 1 is a step function. The input voltage $V_{IN}$ may be any other voltage function. The circuit 100 includes an output 104 where a voltage $V_{OUT}$ is generated in response to the input voltage $V_{IN}$.

In many examples, the first simulation program includes a user interface and a library of components. This combination enables a designer to graphically layout the circuit 100. For example, the designer may select the inductor L10 from a plurality of stored inductor types and may assign certain values to it, such as the inductance, number of windings, resistance, and other characteristics. The first simulation program may map the selected components from a library associated with the first simulation program to a library associated with the second simulation program. The same applies to the input voltage $V_{IN}$ and the integrated circuit U10. The designer may select from a plurality of input voltages $V_{IN}$ or may design a specific input voltage $V_{IN}$.

If a component is not stored in the library of the first simulation program, the first simulation program or the designer may import it from another source or the designer may generate characteristics for the component. With regard to the integrated circuit U10, the designer may cause the first simulation program to import the characteristics of the integrated circuit U10 from a source, such as the manufacturer of the first integrated circuit U10. In some examples, the characteristics of the imported components, such as the integrated circuit U10, are encoded and/or encrypted in a conventional manner.

The first simulation program further includes the ability to generate connections within the circuit 100 in a certain format. Not all the circuit simulation programs have the same connection format. The connection format may include a certain grid format for placement of the components of the circuit, so their contact nodes are located at specific locations. The contact nodes of the components are then connected by way of the connections, which extend on the grid format. Accordingly, the first simulation program has to track the locations of the contact nodes so that the connections may be generated. The connection format of the first simulation program is converted to the connection format of the second simulation program.

Figure 2:
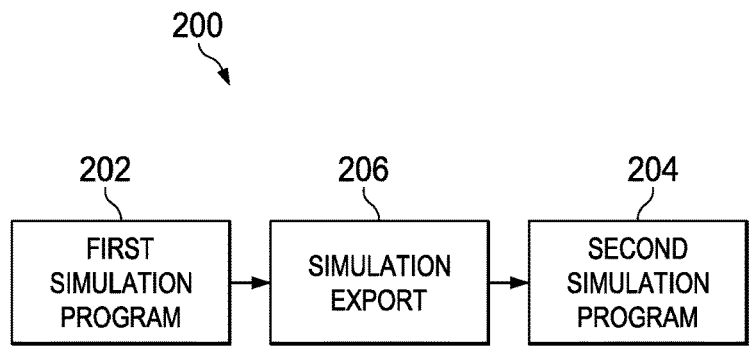
FIG. 2 is a block diagram of an example process for converting a circuit simulated by a first simulation program for simulation by a second simulation program.

FIG. 2 is a flowchart 200 describing the flow between a first simulation program 202 and a second simulation program 204 for examples when the first and second simulation programs 202 and 204 are similar. The first and second simulation programs 202 and 204 are similar in that they may use the same or similar grid formats and coding for the components in the circuit 100. A simulation export tool 206 performs the transformations required for the second simulation program 204 to open and analyze the circuit 100. For example, the simulation export tool 206 may include a grid translator that translates the grid format of the first simulation program 202 to the grid format of the second simulation program 204. The simulation export tool 206 may also include libraries that translate components and integrated circuits from a format used by the first simulation program 202 to a format used by the second simulation program 204.

A designer using the first simulation program 202 inputs a circuit, such as the circuit 100, into the first simulation program 202. The designer then instructs the first simulation program 202 to export the circuit to the second simulation program 204. The first simulation program 202 runs the simulation export tool 206 to convert certain components in the circuit and possibly convert the layout or grid differences between the first simulation program 202 and the second simulation program 204. In some examples, components of the circuit in the first simulation program 202 are mapped to components in the second simulation program 204. The first simulation program 202 or the export simulation tool 206 generates a file, which in some examples is a single file that includes all the parameters of the circuit. The file generated by the first simulation program 202 or the export simulation tool 206 is readable by the second simulation program 204.

In some examples, the first simulation program 202 or the simulation export tool 206 performs a simulation of the circuit on the first simulation program 202. The simulation export tool 206 may then run a simulation on the second simulation program 204 using the parameters generated by the first simulation program 202 and/or the simulation export tool 206. The simulation on the first simulation program 202 and the second simulation program 204 should be the same or within certain parameters. If so, then the conversion of the circuit for use by the second simulation program 204 is correct. If the results of the simulations are different or are not within the parameters, the circuit as formatted for the second simulation program 204 is not correct.

Figure 3:
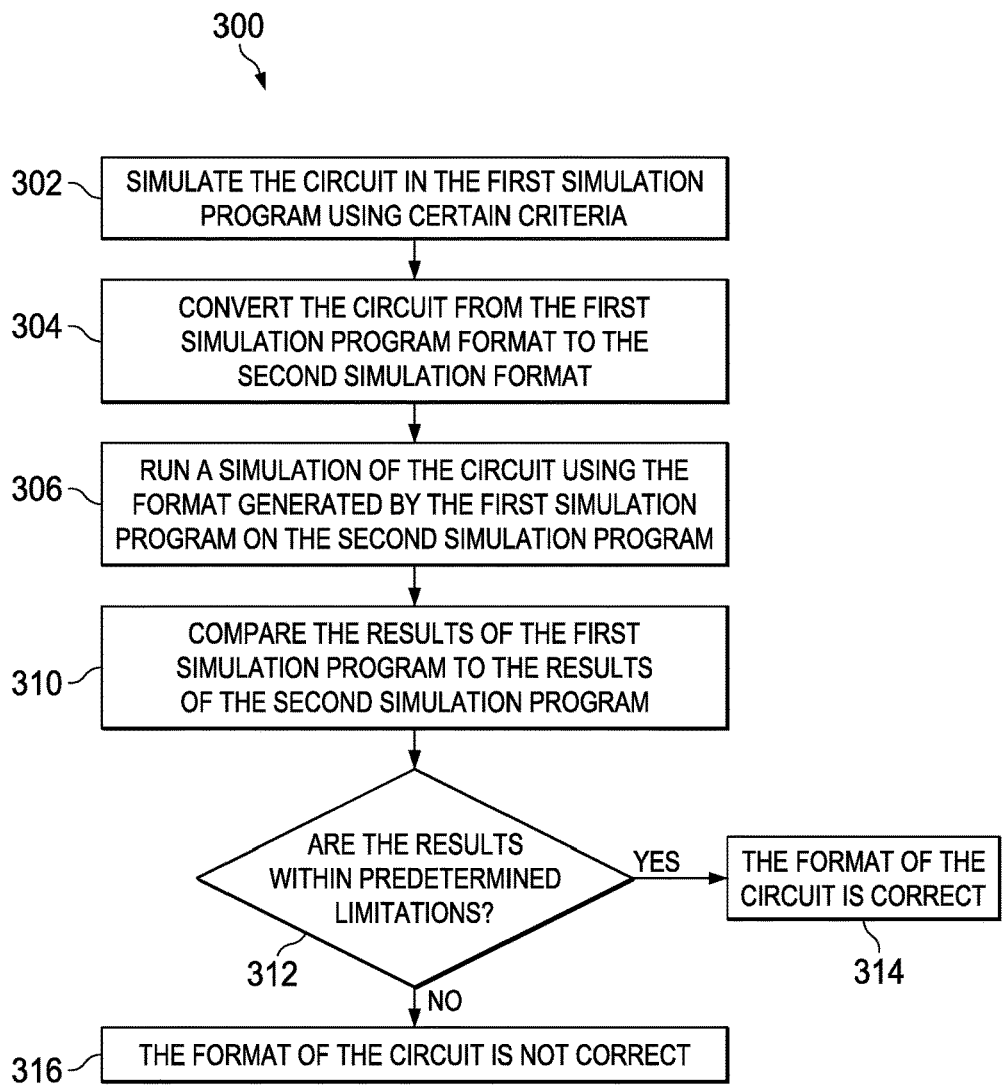
FIG. 3 is a flowchart describing an embodiment for running a simulation of the circuit on the second simulation program of FIG. 2.

FIG. 3 is a flowchart 300 describing an embodiment for running a simulation of the circuit 100 on the second simulation program 204. The flowchart 300 commences at step 302 with simulating the circuit by the first simulation program 202 using certain criteria. The criteria may be predetermined parameters, such as input voltages and frequencies. The results of the simulation are stored for future comparison. In step 304, the process continues by converting the components of the circuit from the format of the first simulation program 202 to the format of the second simulation program 204. The format of the circuit may be provided in a single program or software file. The circuit simulation is run on the second simulation program using the circuit format generated by the first simulation program 202 in step 306.

In step 310, the results from the simulation run by the first simulation program 202 are compared to the results from the simulation run by the second simulation program 204. Decision block 312 determines if the results from the simulation programs are within predetermined limitations. If the results of the two simulations are not within predetermined limits, then the format of the circuit generated by the first simulation program 202 is not correct or cannot be run by the second simulation program 204 as noted in step 312. If the results of the two simulations are within predetermined limits, then the format of the circuit generated by the first simulation program 202 is correct or can be run by the second simulation program 204 as noted in step 314. If the results of the two simulations are not within predetermined limits, then the format of the circuit generated by the first simulation program 202 is not correct or cannot be run by the second simulation program 204 as noted in step 316.

If the results of the two simulations are not within the predetermined limits, adjustments may be made to simulation options in the first simulation program 202. In the case of a simulation program with integrated circuit emphasis (SPICE) simulation, changes to the simulation options may include changing the absolute tolerances, relative tolerances, etc. Some of the options are described in the table 400 of FIG. 4. These adjustments can be performed one at a time and running simulations after every adjustment. Alternatively, several adjustments may be made before running another simulation. After the adjustments are made to the simulation parameters, subsequent test simulations are run to determine if the adjustments were able to bring the results of the two simulations within the predetermined limitations. After a set of conditions is found that meet the predetermined limits, the exported format generated by the first simulation program 202 is deemed correct. If no conditions are found that bring the results of the first and second simulation programs within the predetermined limits, then the export process is terminated and the designer is notified of the failure.

FIG. 5 is a flowchart 500 describing the flow between a first simulation program 502 and a second simulation program 504 wherein the first and second simulation programs 502 and 504 are not necessarily similar. The first simulation program 502 may be an online or web-based program and the second simulation program 504 may run locally on a designer's workstation or personal computer. The first and second simulation programs 502 and 504 may not use the same or similar grid formats and coding for the components in the circuit 100. In this situation, a second simulation program connector 506, referred to as the connector 506, runs in conjunction with the second simulation program 504. A simulation export tool 510 functions substantially similar to the simulation export tool 206 of FIG. 2. The flowchart 500 includes a simulation exchange XML 512 to show the generation of an XML file for export of the circuit generated by the first simulation program 502. It is noted that file formats other than XML files may be generated.

The first simulation program 502 and the simulation export tool 510 function in the same or substantially the same manner as the first simulation program 202 and the simulation export tool 206 of FIG. 2. The simulation export tool 510 generates a file 512, which in the example of FIG. 5 is an XML file. The XML file 512 includes all the aforementioned criteria related to the circuit, such as the grid, connections, components, and certain unique characteristics. The unique characteristics may be, as an example, inductors with different resistances or unique integrated circuits.

The second simulation program 504 may not be able to read the file 512. To overcome this situation, the connector 506 translates the file 512 to the specific format required by the second simulation program 504. In a similar manner, the connector 506 may translate the items in the file 512 to formats that are readable by the second simulation program 504. Each individual second simulation program 504 may have its own connector 506 to translate the items in the XML file to a format that is readable by the individual second simulation program 504. In some examples, the designer using the second simulation program 504 downloads the connector 506 and installs it into the second simulation program 504. The first simulation program 502 may run the simulation on the second simulation program 504 per the flowchart 300 of FIG. 3 to determine if the conversion of the circuit is correct.

In some examples, the first simulation programs 202 and 502 export symbols and simulation results to the second simulation programs 204 and 504. For example, results of simulations generated by the first simulation programs 202 and 502 may be exported to the second simulation programs 204 and 504.

The transfer between different simulation programs described herein is helpful in circuit design. In one example, a circuit is required to have specific criteria. The circuit may include an integrated circuit coupled to a plurality of passive devices. The first simulation program may include a feature that allows a designer to input a simple set of requirements such as the above-described specific criteria. The requirements may include input voltage, output voltage, and output current for a voltage regulator or the 3 dB frequency, attenuation frequency, and attenuation amount for an active filter. The first simulation program then generates the circuit and bill of materials including the passive components surrounding the integrated circuit to achieve the above-described specific criteria.

The selection of the passive components in the circuit will directly affect the desired behavior of the circuit. The designers may use the first simulation program to evaluate the behavior of the circuit. The designers can adjust and change the components in the circuit to further optimize the circuit and run more simulations to determine if the design of the circuit meets the above-described requirements. The designer can then export the circuit as described above to a second simulation program. The designer may use the second simulation program to combine the above-described circuit into a larger circuit containing other elements.

Figure 6:
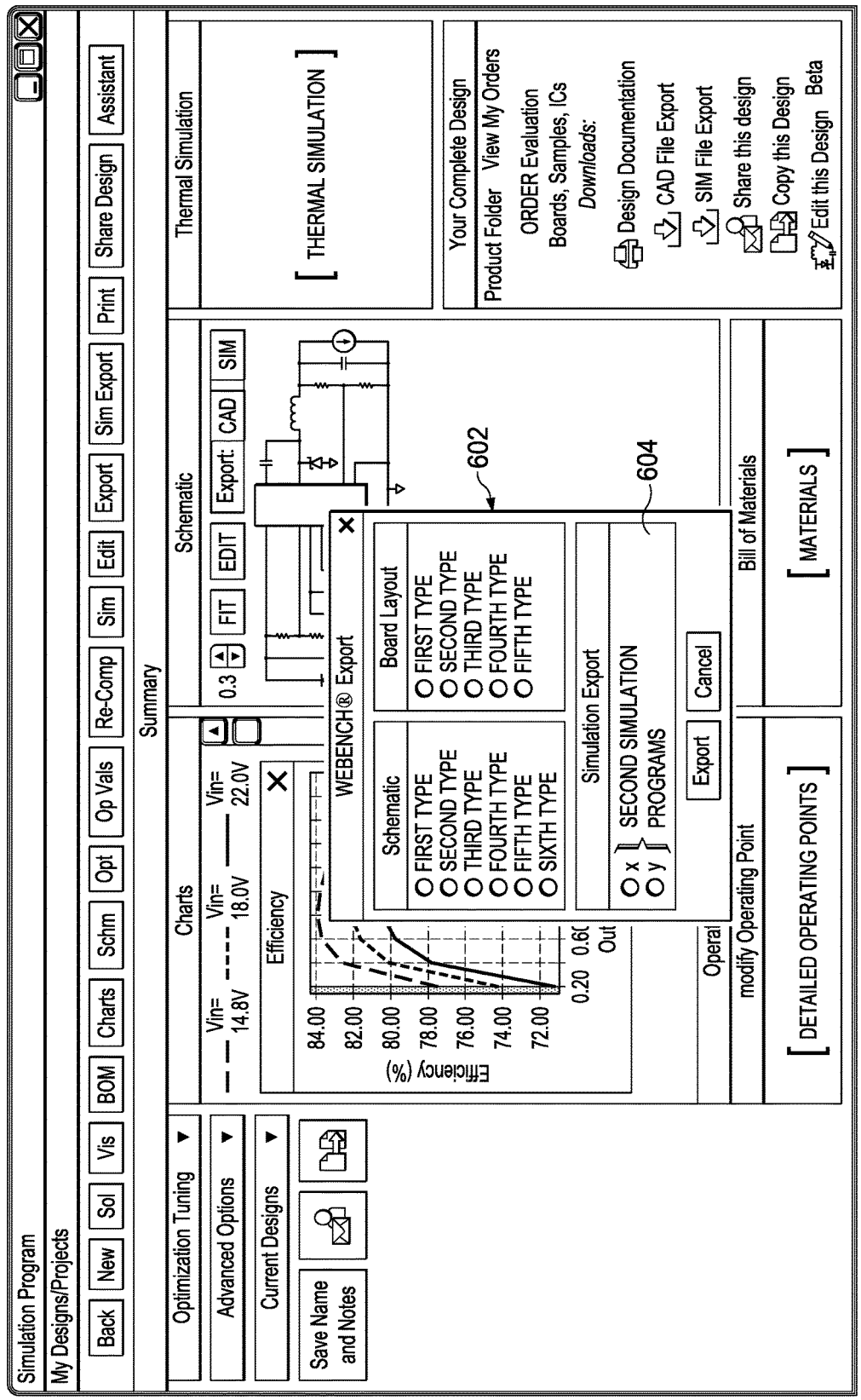
FIG. 6 is an example screen shot of a first simulation program initialized to perform a conversion of a circuit to the format of a second simulation program.

FIG. 6 is an example screen shot 600 of a first simulation program initialized to perform a conversion of a circuit to the format of a second simulation program. The screen shot 600 is an example of a plurality of different user interfaces that the first simulation programs may provide to designers.

The screen shot 600 includes a popup window 602 that in the example screen shot 600 is initialized in response to the designer performing a function to convert the circuit laid out in the first simulation program to the format that is readable by the second simulation program. The popup window 602 includes inquires into the schematic, board layout, and the format of the second simulation program. In the example popup window 602, there is a plurality of schematic types described as the first through the sixth schematic types. The different schematic types may be different circuit types or different software versions. The board layout includes the first type through the fifth type. The different board layout times may be different circuit types or different software in the board layout.

The popup window 602 includes a box 604 of different second simulation programs. In the example of FIG. 2, there are two second simulation program, X and Y, from which the designer may select. Upon selection of the format of the second simulation program or other user input, the first circuit simulation program generates the file readable by the second simulation program as described above, wherein the file contains the circuit formatted for the second simulation program. All the data in the screen shot 600 may be included in the file for reading by the second simulation program including, simulation results, thermal simulations, a bill of materials, and detailed operating points.

While some examples of circuit simulation programs have been described in detail herein, it is to be understood that the inventive concepts may be otherwise variously embodied and employed and that the appended claims are intended to be construed to include such variations except insofar as limited by the prior art.

What is claimed is:

1. A method for converting a circuit in a first format of a first circuit simulation program to a second format of a second circuit simulation program, the method comprising:
   identifying components in the circuit in the first format that are recognized by the second simulation program;
   creating characteristics for components that are not recognized by the second simulation program;
   converting connections in the circuit in the first format to the second format that is recognized by the second simulation program;
   running a first simulation of the circuit in the first format using the first simulation program;
   generating a file representing the circuit in the second format;
   running a second simulation of the circuit in the second format by the second simulation program running the file;
   comparing at least one result of the first simulation to at least one result of the second simulation; and
   determining whether the file is correct in response to the comparing the at least one result of the first simulation to the at least one result of the second simulation.

2. The method of claim 1, further comprising rejecting the file representing the circuit in response to the comparing the at least one result of the first simulation to the at least one result of the second simulation being different by at least a predetermined amount.

3. The method of claim 1, wherein the first simulation and the second simulation are run under the same operating criteria.

4. The method of claim 1, further comprising adjusting at least one operating characteristic of the first simulation in response to the comparing the at least one result of the first simulation to the at least one result of the second simulation being different from the result of the second simulation.

5. The method of claim 1, wherein generating a file comprises:
- identifying components in the circuit that are recognized by the second simulation program;
- creating characteristics for components that are not recognized by the second simulation program;
- converting connections in the circuit to a format that is recognized by the second simulation program; and
- storing the components, characteristics, and connections in the file.

6. The method of claim 5, wherein the storing further comprises storing results from a simulation performed on the circuit by the first simulation program.

7. The method of claim 1, wherein the first simulation program operates online and the second simulation program operates offline.

8. The method of claim 1, wherein the first simulation program operates offline and the second simulation program operates online.

* * * * *